(12) United States Patent
Kwak

(10) Patent No.: US 12,166,461 B2
(45) Date of Patent: Dec. 10, 2024

(54) BAND PASS FILTER AND RECEIVER MODULE

(71) Applicant: SAMSUNG ELECTRO-MECHANICS CO., LTD., Suwon-si (KR)

(72) Inventor: Eunhyuk Kwak, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 18/114,549

(22) Filed: Feb. 27, 2023

(65) Prior Publication Data
US 2024/0171153 A1 May 23, 2024

(30) Foreign Application Priority Data

Nov. 21, 2022 (KR) .................. 10-2022-0156022

(51) Int. Cl.
*H03H 11/04* (2006.01)
(52) U.S. Cl.
CPC .................................. *H03H 11/04* (2013.01)
(58) Field of Classification Search
CPC ...... H03H 7/38; H03H 7/0115; H03H 7/1775; H03H 7/1766; H03H 7/48; H03H 7/1758; H03H 7/1708; H03H 7/09; H03H 7/1791; H03H 7/0138; H03H 2007/013
See application file for complete search history.

(56) References Cited

U.S. PATENT DOCUMENTS

| | | | | |
|---|---|---|---|---|
| 5,157,362 A | * | 10/1992 | Zelenz | H03H 7/1791 333/170 |
| 6,842,086 B1 | * | 1/2005 | Zennamo, Jr. | H03H 7/0153 333/175 |
| 2016/0204755 A1 | * | 7/2016 | Kando | H03H 9/6483 333/175 |
| 2020/0028493 A1 | * | 1/2020 | Ta | H03H 7/0138 |
| 2021/0265979 A1 | * | 8/2021 | Inoue | H03H 9/0566 |

FOREIGN PATENT DOCUMENTS

| | | |
|---|---|---|
| JP | 2008-529360 A | 7/2008 |
| JP | 2011-250160 A | 12/2011 |
| JP | 4968305 B2 | 7/2012 |

OTHER PUBLICATIONS

Leung, Wing-Yan, et al. "Multilayer LTCC bandpass filter design with enhanced stopband characteristics." *IEEE microwave and wireless components letters* 12.7 (2002). pp. 240-242.
Deng, Jianhua, Bing-Zhong Wang, and Tiguo Gan. "Compact LTCC bandpass filter design with controllable transmission zeros in the stopband." *Microwave and optical technology letters* 48.10 (2006). pp. 1919-1922.

(Continued)

*Primary Examiner* — John W Poos
(74) *Attorney, Agent, or Firm* — NSIP Law

(57) ABSTRACT

A band pass filter includes a resonator including a first inductor and a first capacitor coupled in series between a first port and a second port, a second inductor coupled in parallel with the resonator, a second capacitor coupled in parallel with the resonator, and a third capacitor coupled between one end of the second capacitor and the ground to perform a low pass filter function.

11 Claims, 11 Drawing Sheets

(56) References Cited

OTHER PUBLICATIONS

Qin, Qianqian, et al. "Miniaturization of 5G N77 bandpass filter with HR-Si IPD technology." *2020 IEEE International Conference on Integrated Circuits, Technologies and Applications (ICTA)*. IEEE, (2020). pp. 116-118.

Jiang, Yan, et al. "Bandpass Filter With Ultra-Wide Upper Stopband on GaAs IPD Technology." *IEEE Transactions on Circuits and Systems II: Express Briefs* 69.2 (2021). pp. 389-393.

* cited by examiner

BAND PASS FILTER AND RECEIVER MODULE

CROSS-REFERENCE TO RELATED APPLICATIONS

This application claims the benefit under 35 USC 119(a) of Korean Patent Application No. 10-2022-0156022 filed on Nov. 21, 2022, in the Korean Intellectual Property Office, the entire disclosure of which is incorporated herein by reference for all purposes.

BACKGROUND

1. Field

The present disclosure relates to a band pass filter and a receiver module including the same.

2. Description of the Background

Objectives for electronic devices such as mobile phones may include down-sizing, increase in frequency band, diversification of functions, and strengthening of functions. Accordingly, down-sizing for modules mounted on electronic devices and integrated circuits (ICs) forming the modules may also be an objective.

The band pass filter, one of the core ICs, objective may also be down-sizing, and due to the increase and diversification of the frequency band used, the band pass filter objective may be directed to having excellent cut-off characteristics in the band adjacent to the main frequency band, and due to the increase of commercial frequency band, harmonic frequency attenuation characteristic. Therefore, a goal may be to develop a band pass filter to meet these objectives.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a band pass filter includes a resonator including a first inductor and a first capacitor coupled in series between a first port and a second port, a second inductor coupled in parallel with the resonator, a second capacitor coupled in parallel with the resonator, and a third capacitor coupled between one end of the second capacitor and the ground to perform a low pass filter function.

The band pass filter may further include a fourth capacitor coupled in series with the second capacitor between the first port and the second port, and coupled in parallel with the resonator.

The third capacitor may be coupled between a node between the second capacitor and the fourth capacitor and the ground.

The band pass filter may further include a fifth capacitor coupled between the first port and the ground, and a sixth capacitor coupled between the second port and the ground.

The band pass filter may further include a fourth capacitor coupled between the other end of the second capacitor and the ground.

The third capacitor may reduce a harmonic frequency component included in a high frequency band in a radio frequency (RF) signal input to the first port.

The band pass filter may further include a third inductor that is coupled in series between the third capacitor and the ground.

The third capacitor and the third inductor may be configured to perform a band stop filter function.

The band pass filter may further include a fourth capacitor coupled in series with the second capacitor between the first port and the second port, and coupled in parallel with the resonator, wherein the third capacitor may be coupled between a node between the second capacitor and the fourth capacitor, and the ground.

The band pass filter may further include a fifth capacitor and a fourth inductor coupled in series between the first port and the ground, and a sixth capacitor and a fifth inductor coupled to each other between the second port and the ground.

The band pass filter may further include a fourth capacitor and a fourth inductor coupled in series between the other end of the second capacitor and the ground.

In another general aspect, a receiving module includes a switch integrated circuit (IC) that switches a received radio frequency (RF) signal, a band pass filter that passes a main frequency band in the RF signal transmitted from the switch IC, and a low noise amplifier that amplifies a signal transmitted from the band pass filter. The band pass filter includes a resonator including a first inductor and a first capacitor coupled in series between an input port and an output port of the band pass filter, a second inductor coupled between the input port and the output port and coupled in parallel with the resonator, a second capacitor coupled between the input port and the output port and coupled in parallel with the resonator, and a third capacitor coupled between one end of the second capacitor and the ground to perform a low pass filter function.

The band pass filter may further include a fourth capacitor coupled in series with the second capacitor between the input port and the output port, and coupled in parallel with the resonator, and the third capacitor may be coupled between a node between the second capacitor and the fourth capacitor and the ground.

The band pass filter may further include a fifth capacitor coupled between the input port and the ground, and a sixth capacitor coupled between the output port and the ground.

The band pass filter may further include a fourth capacitor coupled between the other end of the second capacitor and the ground.

The band pass filter may further include a third inductor coupled in series between the third capacitor and the ground, and the third capacitor and the third inductor are configured to perform a band stop filter function.

The band pass filter may further include a fourth capacitor coupled in series with the second capacitor between the input port and the output port, and coupled in parallel with the resonator, and the third capacitor may be coupled between a node between the second capacitor and the fourth capacitor and the ground.

The band pass filter may further include a fifth capacitor and a fourth inductor coupled in series between the input port and the ground, and a sixth capacitor and a fifth inductor coupled to each other between the output port and the ground.

The band pass filter may further include a fourth capacitor and a fourth inductor coupled in series between the other end of the second capacitor and the ground.

In another general aspect, a band pass filter includes a resonator including a first inductor and a first capacitor coupled in series between a first port and a second port, a second inductor coupled in parallel with the resonator, one or more second capacitors coupled in parallel with the resonator, and one or more third capacitors coupled between one or more ends of the one or more second capacitors and the ground to perform a low pass filter function, wherein the one or more second capacitors and the one or more third capacitors are disposed symmetrically with each other between the first port and the second port.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
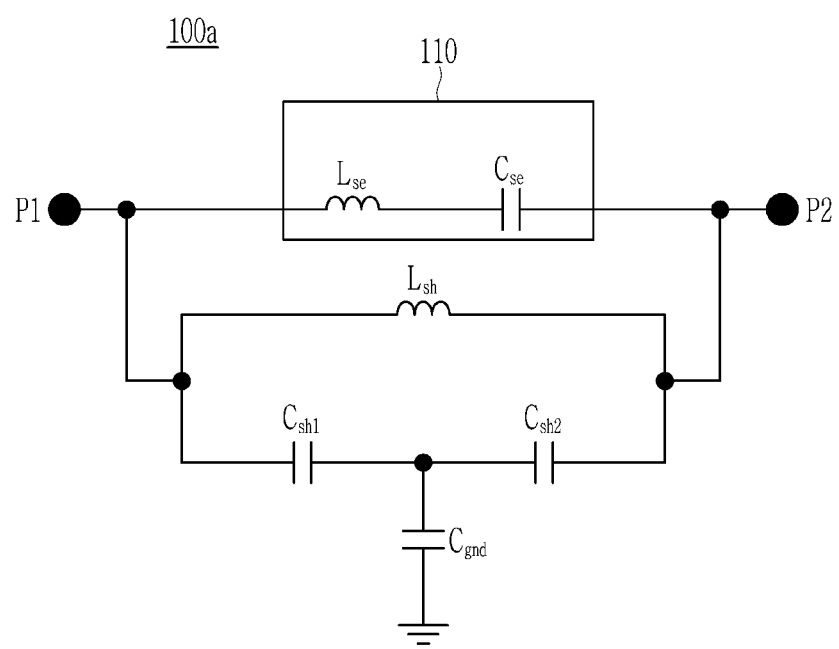
FIG. 1 is a circuit diagram of a band pass filter according to an embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Throughout the specification, a radio frequency (RF) signal may a format of Wi-Fi (IEEE 802.11 family, etc.), WiMAX (IEEE 802.16 family, etc.), IEEE 802.20, LTE (long term evolution), Ev-DO, HSPA, HSDPA, HSUPA, EDGE, GSM, GPS, GPRS, CDMA, TDMA, DECT, Bluetooth, 3G, 4G, 5G, and any other wireless and wired protocols designated thereafter, but the present disclosure is not limited thereto.

One or more embodiments of the disclosure is to provide a band pass filter that may improve cutting-off characteristics for low-frequency band widths and high-frequency bands that are adjacent to a main frequency band, and may have harmonic attenuation characteristics.

FIG. 1 is a circuit diagram of a band pass filter 100a according to an embodiment.

A band pass filter 100a according to an embodiment may pass a main frequency band in an input RF signal. The band pass filter 100a may pass the main frequency band from the RF signal input to a first port P1 and output it to a second port P2. On the other hand, the band pass filter 100a may pass the main frequency band from the RF signal input to the second port P2 and output it to the first port P1. That is, since the band pass filter 100a according to one embodiment has a symmetric internal configuration, an RF signal may be input to the first port P1 and an RF signal may be input to the second port P2. Here, the main frequency band means a frequency band that the band pass filter 100a wants to pass. In the following description, the term "main frequency band" may be used interchangeably with the term "pass band".

As shown in FIG. 1, the band pass filter 100a according to an embodiment may include an inductor $L_{se}$, a capacitor $C_{se}$, an inductor $L_{sh}$, a capacitor $C_{sh1}$, a capacitor $C_{sh2}$, and a capacitor $C_{gnd}$.

One end of the inductor $L_{se}$ may be connected to the first port P1, and the capacitor $C_{se}$ may be connected between the other end of the inductor $L_{se}$ and the second port P2. The inductor $L_{se}$ and the capacitor $C_{se}$ are coupled in series between the first port P1 and the second port P2 such that a resonator 110 can be formed. The resonator 110 can perform a function of passing the main frequency band through LC resonance. The arrangement of the inductor $L_{se}$ and capacitor $C_{se}$ may be changed (exchanged) with each other. That is, one end of the capacitor $C_{se}$ may be connected to the first port P1, and the inductor $L_{se}$ may be connected between the other end of the capacitor $C_{se}$ and the second port P2.

One end of the inductor $L_{sh}$ h may be connected to the first port P1, and the other end of the inductor $L_{sh}$ may be connected to the second port P2. That is, the inductor $L_{sh}$ is coupled in parallel with the resonator 110. The inductor $L_{sh}$ together with the resonator 110 may serve to cut-off for an adjacent low frequency band. Here, the adjacent low frequency band may mean a frequency band that is adjacent to the main frequency band and lower than the main frequency band.

In addition, one end of the capacitor $C_{sh1}$ may be connected to the first port P1, and the capacitor $C_{sh2}$ may be connected between the other end of the capacitor $C_{sh1}$ and the second port P2. In one aspect, the capacitor $C_{sh}$, is coupled in parallel with the resonator 110, and the capacitor $C_{sh2}$ is also coupled in parallel with the resonator 110. In addition, in another aspect, the capacitor $C_{sh1}$ and the capacitor $C_{sh2}$ are coupled in series between first port P1 and second port P2. The capacitor $C_{sh1}$ and the capacitor $C_{sh2}$ together with the resonator 110 may serve to cut-off for an adjacent high frequency band. Here, the adjacent high frequency band may mean a frequency band that is adjacent to the main frequency band and higher than the main frequency band.

A capacitor $C_{gnd}$ may be connected between a node between the capacitor $C_{sh1}$ and the capacitor $C_{sh2}$, and the ground. That is, the capacitor $C_{gnd}$ may be connected between the other end of the capacitor $C_{sh1}$ and the ground. The capacitor $C_{gnd}$ may serve to reduce harmonic components. Since the capacitor $C_{gnd}$ is connected to the ground between the first port P1 and the second port P2, it may serve as a low pass filter (LPF). That is, the capacitor $C_{gnd}$ may pass the low frequency band of the input RF signal and bypass the high frequency band to the ground. Accordingly, the harmonic components included in the high frequency band may be reduced. Meanwhile, in another aspect, the capacitor $C_{gnd}$, the capacitor $C_{sh1}$, and the capacitor $C_{sh2}$ together with the resonator 110 may serve to cut-off for an adjacent high frequency band.

In a band pass filter 100a according to one embodiment, a center frequency $f_Z$ of a main frequency band (pass band) may be expressed as Equation 1 below.

$$f_Z = \frac{1}{2\pi\sqrt{L_{se}C_{se}}} \quad \text{(Equation 1)}$$

As shown in Equation 1, the main frequency $f_Z$ of the main frequency band (pass band) may be determined by the inductor $L_{se}$ and the capacitor $C_{se}$ included in the resonator 110.

In the band pass filter 100a according to an embodiment, the capacitor $C_{gnd}$, the capacitor $C_{sh1}$ may serve to cut-off an adjacent high frequency band together with the resonator 110, and in this case, a center frequency $f_{pH}$ of a high frequency cut-off band may be expressed as Equation 2 below.

$$f_{pH} \approx \frac{1}{2\pi\sqrt{\dfrac{C_{sh}C_{se}L_{se}}{C_{sh}+C_{se}}}} \quad \text{(Equation 2)}$$

In Equation 2, $C_{sh}$ represents an equivalent capacitor for the capacitor $C_{sh1}$, the capacitor $C_{sh2}$, and the capacitor $C_{gnd}$. As shown in Equation 2, the center frequency $f_{pH}$ of the high frequency cut-off band may be determined by the inductor $L_{se}$, the capacitor $C_{se}$ and the equivalent capacitor $C_{sh}$.

In addition, in the band pass filter 100a according to an embodiment, the inductor $L_{sh}$ may serve to cut-off an adjacent low frequency band together with the resonator 110, and in this case, a main frequency $f_{pL}$ of a low frequency cut-off band may be represented as given in Equation 3 below.

$$f_{pL} \approx \frac{1}{2\pi\sqrt{C_{se}(L_{sh} + L_{se})}} \quad \text{(Equation 3)}$$

As shown in Equation 3, the center frequency $f_{pL}$ of the low frequency cut-off band may be determined by the inductors $L_{se}$ and $L_{sh}$ and the capacitor $C_{se}$.

As described, the band pass filter 100a according to an embodiment may cut-off an adjacent high frequency band and an adjacent low frequency band of the main frequency band.

In addition, referring to FIG. 1, elements of the band pass filter 100a according to an embodiment may be symmetrically arranged between the first port P1 and the second port P2. That is, the capacitor $C_{sh1}$, the capacitor $C_{sh2}$, and the capacitor $C_{gnd}$ are arranged symmetrically with each other between the first port P1 and the second port P2. Accordingly, the band pass filter 100a according to an embodiment may have the same input and output impedance. In other words, in the band pass filter 100a according to an embodiment, the impedance at the first port P1 and the impedance at the second port P2 may be the same.

Meanwhile, the capacitor $C_{sh1}$, the capacitor $C_{sh2}$, and the capacitor $C_{gnd}$ in FIG. 1 may be changed into various forms while forming a symmetrical structure with each other, and this will be described hereinafter with reference to FIG. 2 to FIG. 4.

Figure 2:
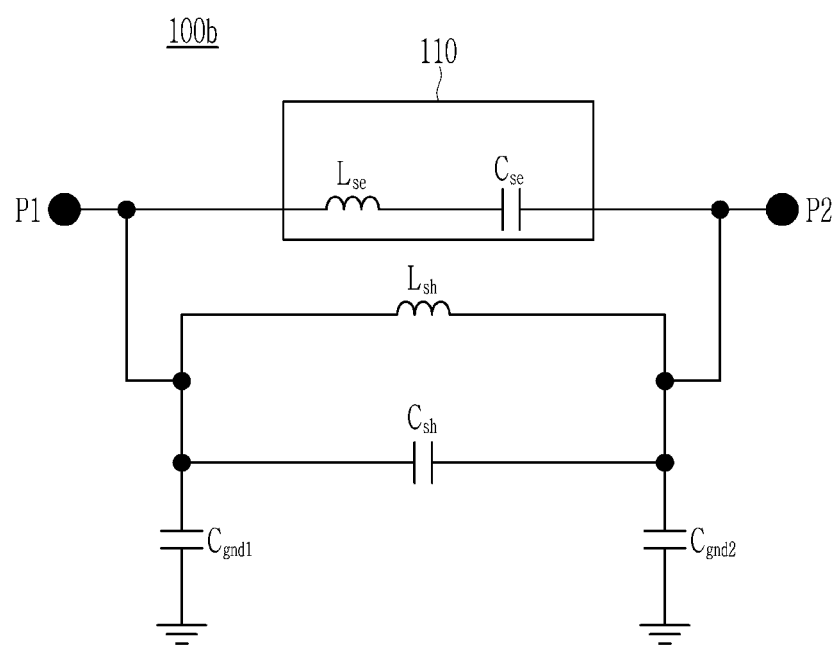
FIG. 2 is a circuit diagram of a band pass filter according to another embodiment.

FIG. 2 is a circuit diagram of a band pass filter 100b according to another embodiment.

As shown in FIG. 2, a band pass filter 100b according to this other embodiment may include an inductor $L_{se}$, a capacitor $C_{se}$, an inductor $L_{sh}$, a capacitor $C_{sh1}$, a capacitor $C_{gnd1}$ and a capacitor $C_{gnd2}$.

The band pass filter 100b of FIG. 2 is substantially the same as the band pass filter 100a of FIG. 1, except for a change in a symmetric arrangement structure of a capacitor $C_{sh}$, a capacitor $C_{gnd1}$ and a capacitor $C_{gnd2}$. The capacitor $C_{sh1}$ and the capacitor $C_{sh2}$ of FIG. 1 are integrated into a capacitor $C_{sh}$, and the capacitor $C_{gnd}$ of FIG. 1 is separated into two capacitors $C_{gnd1}$ and $C_{gnd2}$.

One end of the capacitor $C_{sh}$ may be connected to a first port, and the other end of the capacitor $C_{sh}$ may be connected to a second port P2. That is, the capacitor $C_{sh}$ may be coupled in parallel with the resonator 110. The capacitor $C_{sh}$ may serve to cut-off an adjacent high frequency band together with the resonator 110.

The capacitor $C_{gnd1}$ may be connected between one end of the capacitor $C_{sh}$ (i.e., the first port P1) and the ground, and the capacitor $C_{gnd2}$ may be connected between the other end of the capacitor $C_{sh}$ (i.e., the second port P2) and the ground. Since the capacitor $C_{gnd1}$ and the capacitor $C_{gnd2}$ are respectively connected to the ground between the first port P1 and the second port P2, they may perform a two-stage low-frequency pass filter function. Therefore, the band pass filter 100b may have a better harmonic attenuation characteristic compared to the band pass filter 100a of FIG. 1. Meanwhile, in another aspect, the capacitor $C_{gnd1}$ the capacitor $C_{gnd2}$, and the capacitor $C_{sh}$ may perform a cut-off function for an adjacent high-frequency band together with the resonator 110.

In the band pass filter 100b in this embodiment, a center frequency $f_Z$ of a main frequency band (pass band) is equal to Equation 1.

In addition, in the band pass filter 100b according to this embodiment, a center frequency $f_{pH}$ of an adjacent high frequency cut-off band is substantially the same as Equation 2. However, in Equation 2, $C_{eq}$ may be replaced with an equivalent capacitor with respect to the capacitor $C_{se}$) the capacitor $C_{sh}$, the capacitor $C_{gnd1}$ and the capacitor $C_{gnd2}$.

Meanwhile, the capacitor $C_{sh}$, the capacitor $C_{gnd1}$ and the capacitor $C_{gnd2}$ are arranged symmetrical to each other between the first port P1 and the second port P2. Accordingly, the band pass filter 100b according to this embodiment may also have the same input impedance and output impedance.

Figure 3:
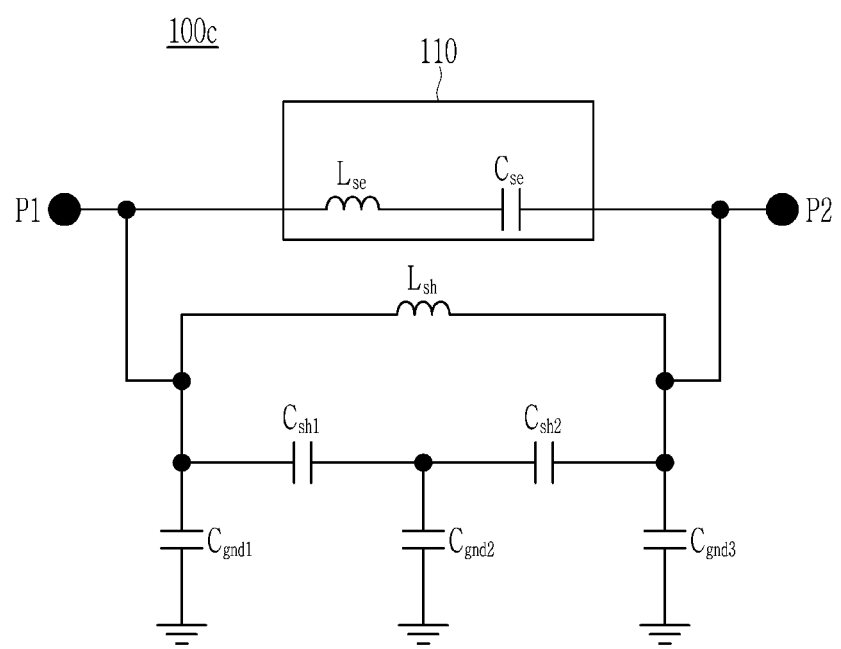
FIG. 3 is a circuit diagram of a band pass filter according to another embodiment.

FIG. 3 shows a circuit diagram of a band pass filter 100c according to another embodiment.

As shown in FIG. 3, a band pass filter 100c according to this other embodiment may include an inductor $L_{se}$, a capacitor $C_{se}$, an inductor $L_{sh}$, a capacitor $C_{sh1}$, a capacitor $C_{sh2}$, a capacitor $C_{gnd1}$, a capacitor $C_{gnd2}$, and a capacitor $C_{gnd3}$.

The band pass filter 100c of FIG. 3 is the same as the band pass filter 100a of FIG. 1, except that the capacitor $C_{gnd1}$ and the capacitor $C_{gnd3}$ that serve to provide a low frequency pass filter function are additionally included.

The capacitor $C_{gnd}$ of FIG. 1 may be separated into three capacitors $C_{gnd1}$, $C_{gnd2}$, and $C_{gnd3}$.

One end of the capacitor $C_{gnd1}$ may be connected between one end of the capacitor $C_{sh1}$ (i.e., the first port P1) and the ground. The capacitor $C_{gnd2}$ may be connected between a node between the capacitor $C_{sh1}$ and the capacitor $C_{sh2}$ and the ground. That is, the capacitor $C_{gnd2}$ may be connected between the other end of the capacitor $C_{sh1}$ and the ground. The capacitor $C_{gnd3}$ may be connected between the second port P2 and the ground. Since the capacitor $C_{gnd1}$, the capacitor $C_{gnd2}$, and the capacitor $C_{gnd3}$ are respectively connected to the ground between the first port P1 and the second port P2, they may provide a three-stage low frequency pass filter function. Therefore, the band pass filter 100c may have a better harmonic attenuation characteristic compared to the band pass filters 100a and 100b of FIG. 1 and FIG. 2. Meanwhile, in another aspect, the capacitor $C_{gnd1}$, the capacitor $C_{gnd2}$, the capacitor $C_{gnd3}$, the capacitor $C_{sh1}$, and the capacitor $C_{sh2}$ may perform a cut-off function for an adjacent high-frequency band together with the resonator 110.

In addition, in the band pass filter 100c according to this embodiment, a center frequency $f_Z$ of a main frequency band (pass band) is the same as Equation 1.

In addition, in the band pass filter 100c according to this embodiment, a center frequency $f_{pH}$ of an adjacent high-frequency cut-off band is substantially the same as Equation 2. However, in Equation 2, $C_{eq}$ may be replaced with an equivalent capacitor with respect to the capacitor $C_{se}$) the capacitor $C_{sh1}$, the capacitor $C_{sh2}$, the capacitor $C_{gnd1}$, the capacitor $C_{gnd2}$, and the capacitor $C_{gnd3}$.

Meanwhile, the capacitor $C_{sh1}$, the capacitor $C_{sh2}$, the capacitor $C_{gnd1}$, the capacitor $C_{gnd2}$, and the capacitor $C_{gnd3}$ are arranged symmetrical to each other between the first port P1 and the second port P2. Accordingly, the band pass filter 100c according to this embodiment may also have the same input impedance and output impedance.

Figure 4:
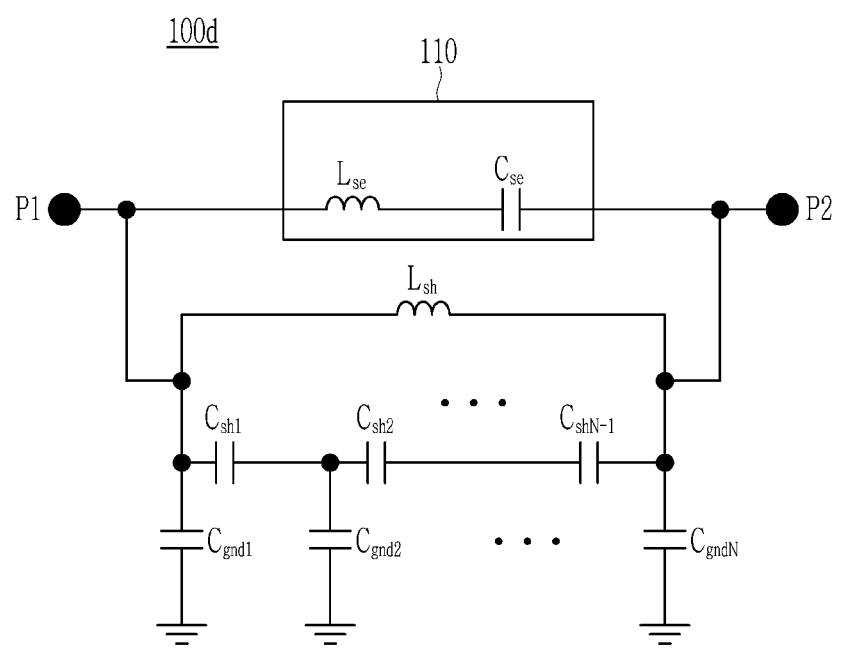
FIG. 4 is a circuit diagram of a band pass filter according to another embodiment.

FIG. 4 shows a circuit diagram of a band pass filter 100c according to another embodiment.

As shown in FIG. 4, a band pass filter 100d according to this other embodiment may include an inductor $L_{se}$, a capacitor $C_{se}$, an inductor $L_{sh}$, a capacitor $C_{sh1}$, a capacitor $C_{sh2}$, ..., and a capacitor $C_{shN-1}$, and a capacitor $C_{gnd1}$, a capacitor $C_{gnd2}$, a capacitor $C_{gnd3}$), ..., and capacitor $C_{gndN}$ Here, N may be any natural number greater than or equal to 4.

The band pass filter 100d of FIG. 4 is the same as the band pass filter 100c of FIG. 3 except that the number of the capacitors $C_{sh1}$ and $C_{sh2}$ of the band pass filter 100c of FIG. 3 are expanded to N−1 and the number of the capacitors $C_{gnd1}$, $C_{gnd2}$, and $C_{gnd3}$ are expanded to N.

The capacitor $C_{gnd1}$, the capacitor $C_{gnd2}$, and the capacitor $C_{gnd3}$, ..., and the capacitor $C_{gndN}$ are connected to the ground between the first port P1 and the second port P2 such that they may provide an N-stage low frequency pass filter function. Accordingly, the band pass filter 100d may have a better harmonic attenuation characteristic compared to the band pass filters 100a, 100b, and 100c of FIG. 1 to FIG. 3.

Meanwhile, in another aspect, the capacitor $C_{gnd1}$, the capacitor $C_{gnd2}$, the capacitor $C_{gnd3}$, ..., and the capacitor $C_{gndN}$, the capacitor $C_{sh1}$ and the capacitor $C_{sh2}$, ..., and the capacitor $C_{shN-1}$ may serve to cut-off an adjacent high frequency band together with the resonator 110. The characteristics of low frequency pass band and harmonic reduction may be determined by capacitors formed of the capacitor $C_{gnd1}$, the capacitor $C_{gnd2}$, the capacitor $C_{gnd3}$, ..., and the capacitor $C_{gndN}$ Here, as the time constant of each of the capacitors $C_{gnd1}$, $C_{gnd2}$, $C_{gnd3}$, ..., and $C_{gndN}$ is increased and N is increased, the harmonic reduction characteristic can be improved. Meanwhile, for a target harmonic reduction characteristic, the number of capacitors $C_{gnd1}$, $C_{gnd2}$, $C_{gnd3}$, ..., and $C_{gndN}$ performing a low frequency band pass function may be adjusted.

In the band pass filter 100d in this embodiment, a center frequency $f_Z$ of a main frequency band (pass band) is equal to Equation 1.

In addition, in the band pass filter 100d according to this embodiment, a center frequency $f_{pH}$ of an adjacent high frequency cut-off band is substantially the same as Equation 2. However, in Equation 2, $C_{eq}$ may be replaced with an equivalent capacitor with respect to the capacitor $C_{se}$) the capacitor $C_{sh1}$, the capacitor $C_{sh2}$, ..., and the capacitor $C_{shN-1}$, and the capacitor C g the $C_{gnd1}$, capacitor $C_{gnd2}$, the capacitor $C_{gnd3}$, ..., and capacitor $C_{gndN}$.

Meanwhile, the capacitor $C_{sh1}$, the capacitor $C_{sh2}$, ..., and the capacitor $C_{shN-1}$, and the capacitor $C_{gnd1}$, the capacitor $C_{gnd2}$, the capacitor $C_{gnd3}$, ..., and the capacitor $C_{gndN}$ are arranged to be symmetrical to each other between the first port P1 and the second port P2. Accordingly, the band pass filter 100d according to this embodiment may also have the same input impedance and output impedance.

In addition, in the band pass filter 100a shown in FIG. 1, a band stop filter (BSF) function may be provided by coupling an inductor L g n d in series between the ground and the capacitor $C_{gnd}$ performing a low-frequency pass filter function.

Figure 5:
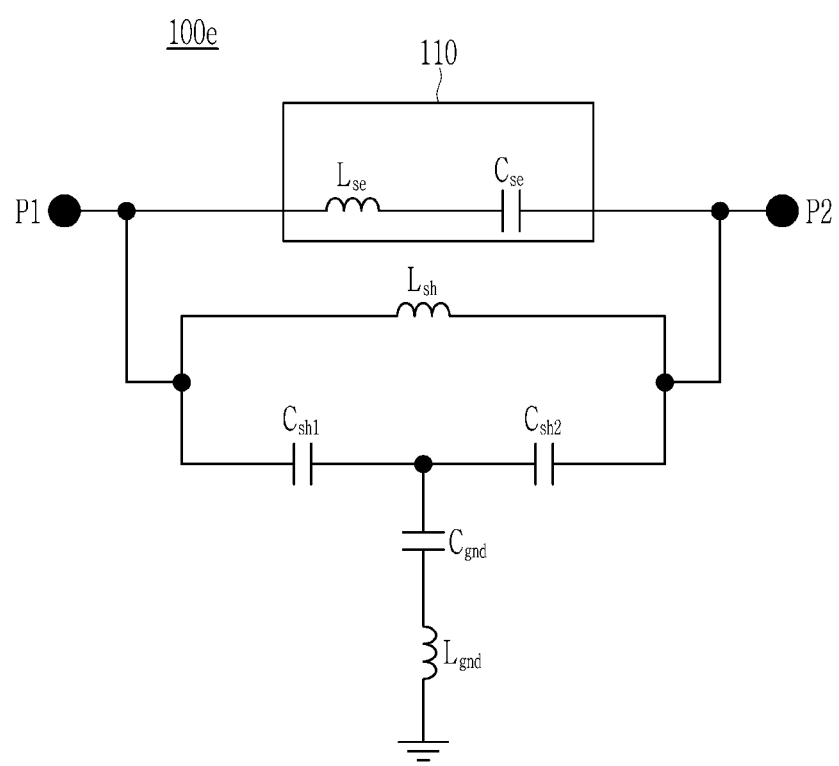
FIG. 5 is a circuit diagram of a band pass filter according to another embodiment.

FIG. 5 is a circuit diagram of a band pass filter 100e according to another embodiment.

Referring to FIG. 5, a band pass filter 100e according to this other embodiment may include an inductor $L_{se}$, a capacitor $C_{se}$, an inductor $L_{sh}$, a capacitor $C_{sh1}$, a capacitor $C_{sh2}$, a capacitor $C_{gnd}$, and an inductor $L_{gnd}$.

The band pass filter 100e of FIG. 5 is the same as the band pass filter 100a of FIG. 1, except that an inductor $L_{gnd}$ is additionally included in the band pass filter 100a of FIG. 1.

The inductor $L_{gnd}$ is coupled in series between the capacitor $C_{gnd}$ and the ground. That is, one end of the inductor $L_{gnd}$ is connected to the other end of the capacitor $C_{gnd}$ of which one end is connected to a node between the capacitor $C_{sh1}$ and the capacitor $C_{sh2}$, and the other end of the inductor $L_{gnd}$ is connected to the ground.

In the case of the band pass filter 100a shown in FIG. 1, the capacitor C g n d is connected to the ground between the first port P1 and the second port P2 such that a low frequency pass filter function can be provided, thereby reducing harmonic frequency components.

Meanwhile, in the band pass filter 100e of FIG. 5, the capacitor $C_{gnd}$ and the inductor $L_{gnd}$ coupled in series to each other are connected to the ground between first port P1 and the second port P2, and thus they may perform a band stop filter function. That is, the inductor $L_{gnd}$ and the capacitor $C_{gnd}$ selectively cut-off a specific high-frequency band of an input RF signal such that harmonic components included in the high frequency band can be reduced.

In addition, in the band pass filter 100e according to this other embodiment, a harmonic cut-off frequency $f_{har}$ for reducing the harmonic components may be represented as given in Equation 4.

$$f_{har} = \frac{1}{2\pi\sqrt{L_{gnd}C_{gnd}}}$$ (Equation 4)

As shown in Equation 4, the harmonic cut-off frequency $f_{har}$ may be determined by the inductor $L_{gnd}$ and the capacitor $C_{gnd}$, and the harmonic cut-off frequency $f_{har}$ may be set to be larger than a center frequency $f_Z$ of a main frequency band (pass band). For example, the harmonic cut-off frequency $f_{har}$ may be set to be $2f_Z$ or higher.

Similar to FIG. 5, the band cut-off filter function may be applied to the band pass filters 100b, 100c, and 100d shown in FIG. 2 to FIG. 4.

Figure 6:
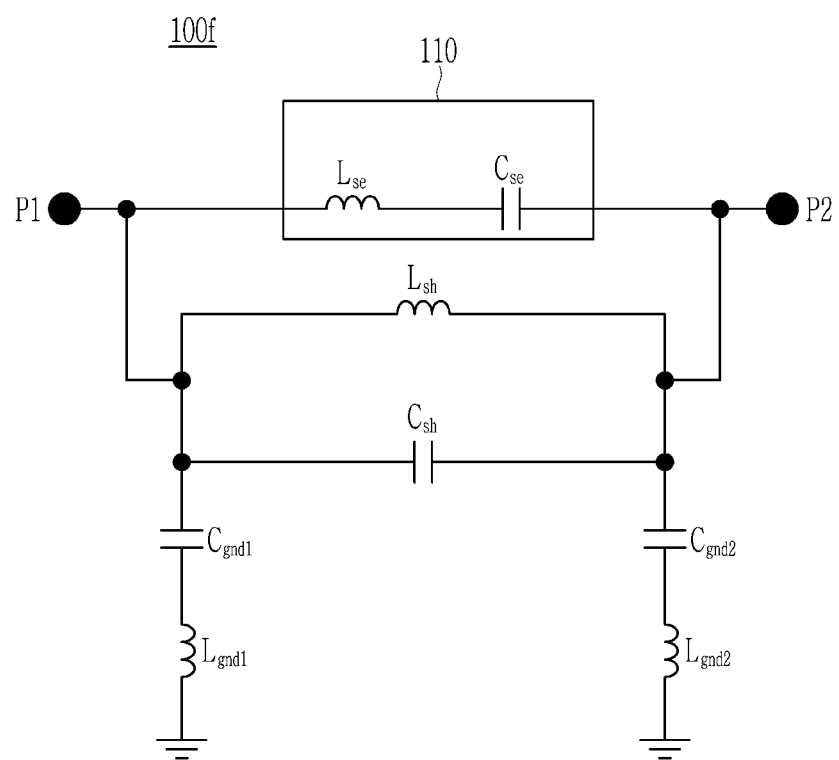
FIG. 6 is a circuit diagram of a band pass filter according to another embodiment.
Figure 7:
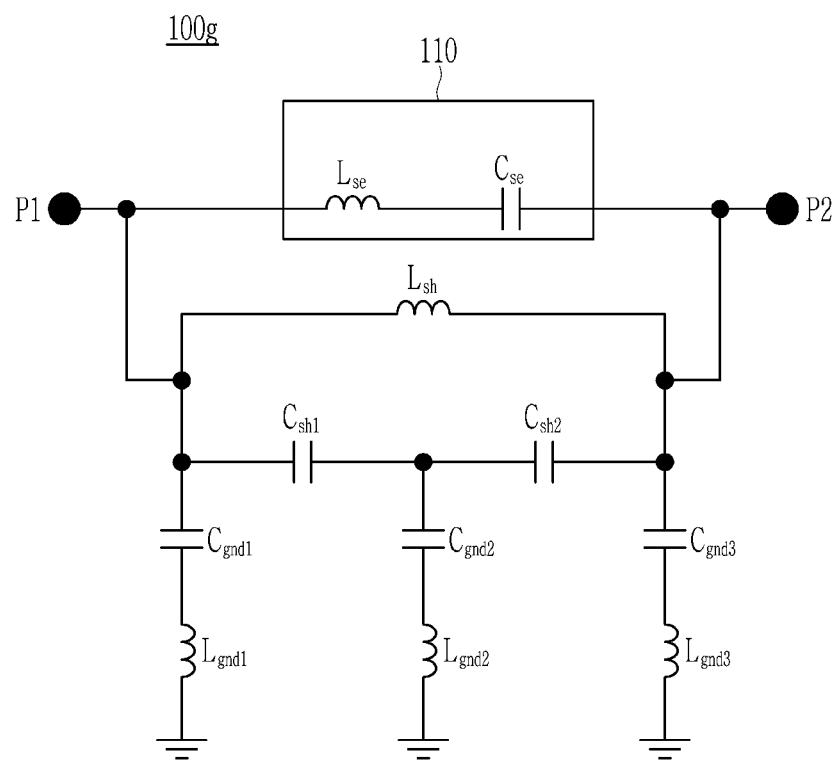
FIG. 7 is a circuit diagram of a band pass filter according to another embodiment.
Figure 8:
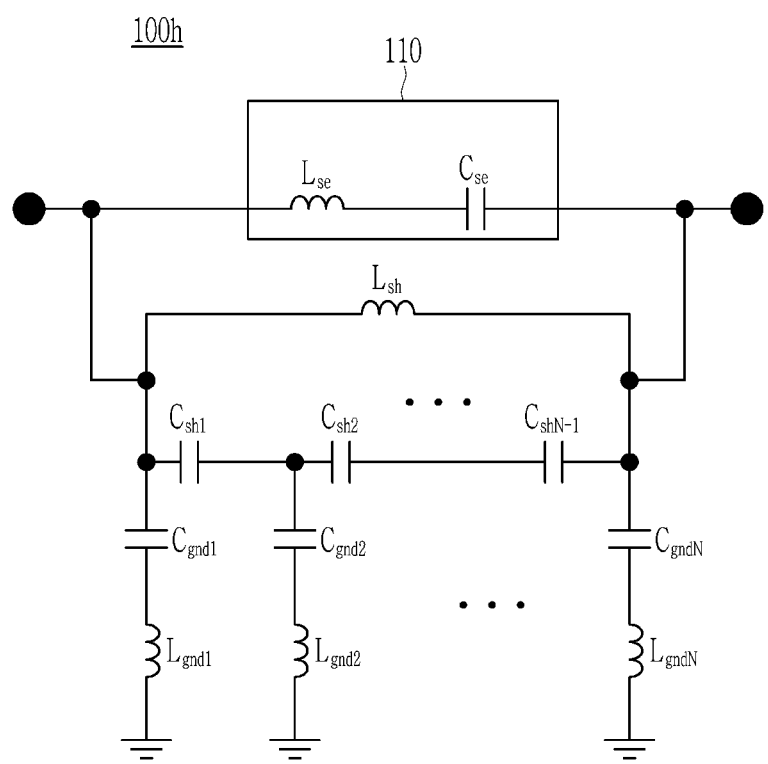
FIG. 8 is a circuit diagram of a band pass filter according to another embodiment.

FIG. 6 to FIG. 8 show circuit diagrams of band pass filters 100f, 100g, and 100h according to other embodiments.

Referring to FIG. 6, a band pass filter 100f according to another embodiment is the same as the band pass filter 100b of FIG. 2, except that an inductor $L_{gnd1}$ and an inductor $L_{gnd2}$ are additionally included to the band pass filter 100b of FIG. 2.

The inductor $L_{gnd1}$ is coupled in series between the capacitor $C_{gnd1}$ and the ground, and the inductor $L_{gnd2}$ is coupled in series between the capacitor $C_{gnd2}$ and the ground.

The inductor $L_{gnd1}$ and the capacitor $C_{gnd1}$, and the inductor $L_{gnd2}$ and the capacitor $C_{gnd2}$ may perform a two-stage band stop filter function. As described, when the band stop filter function is performed in two stages, the band pass filter 100f may have a better harmonic attenuation characteristic compared to the band pass filter 100e of FIG. 5.

In addition, referring to FIG. 7, a band pass filter 100g according to another embodiment is the same as the band pass filter 100c of FIG. 3 except that an inductor $L_{gnd1}$, an inductor $L_{gnd2}$, and an inductor $L_{gnd3}$ are additionally included in the band pass filter 100c of FIG. 3.

The inductor $L_{gnd1}$ is coupled in series between the capacitor $C_{gnd1}$ and the ground, and the inductor $L_{gnd2}$ is coupled in series between the capacitor $C_{gnd2}$ and the ground. In addition, the inductor $L_{gnd3}$ is coupled in series between the capacitor $C_{gnd3}$ and the ground.

The inductor $L_{gnd1}$ and the capacitor $C_{gnd1}$, the inductor $L_{gnd2}$ and the capacitor $C_{gnd2}$, and the inductor $L_{gnd3}$ and the capacitor $C_{gnd3}$ may perform three-stage-BSF function. That is, the inductor $L_{gnd1}$ and the capacitor $C_{gnd1}$, the inductor $L_{gnd2}$ and the capacitor $C_{gnd2}$, and the inductor $L_{gnd3}$ and the capacitor $C_{gnd3}$ may perform three-stage stop filter function. Therefore, the band pass filter 100g may have a better harmonic attenuation characteristic compared to the band pass filters 100e and 100f of FIG. 5 and FIG. 6.

In addition, referring to FIG. 8, a band pass filter 100h according to another embodiment is the same as the band pass filter 100d of FIG. 4, except that an inductor $L_{gnd1}$, an inductor $L_{gnd2}$, an inductor $L_{gnd3}$, . . . , and an inductor $L_{gndN}$ are additionally included in the band pass filter 100d of FIG. 4.

The inductor $L_{gnd1}$, the inductor $L_{gnd2}$, the inductor $L_{gnd3}$, . . . , and the inductor $L_{gndN}$ are respectively coupled in series between the capacitor $C_{gnd1}$, the capacitor $C_{gnd2}$, the capacitor $C_{gnd3}$, . . . , and the capacitor $C_{gndN}$ such that they can provide an N-stage band stop filter function. Therefore, the band pass filter 100h may have a better harmonic attenuation characteristic compared to the band pass filters 100e, 100f, and 100g of FIG. 5 to FIG. 7.

Figure 9:
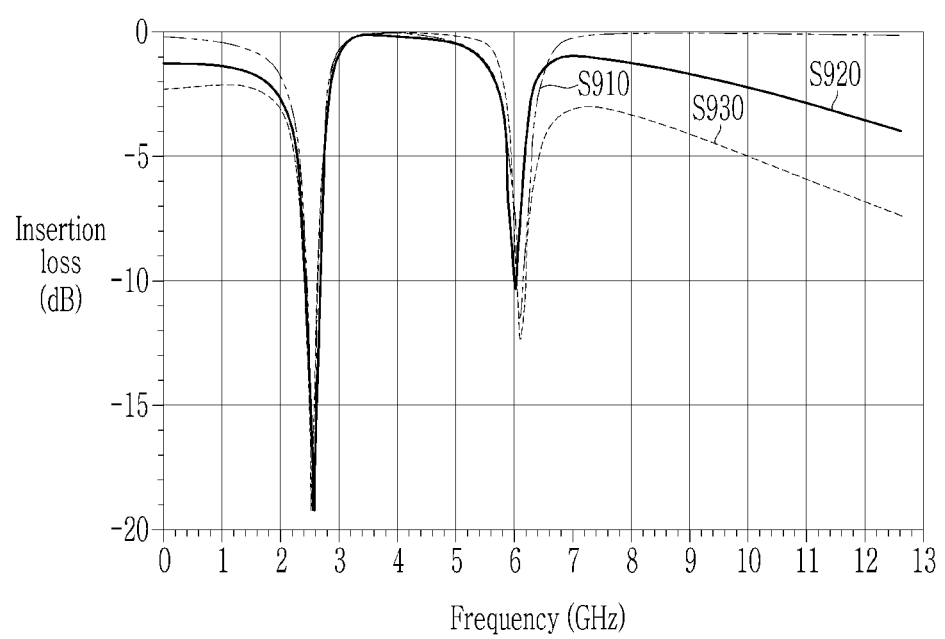
FIG. 9 is a graph that shows a simulation result of the embodiments shown in FIG. 1 and FIG. 2 and a simulation result of a comparative example.

FIG. 9 is a graph that shows a simulation result of the embodiment shown in FIG. 1 and FIG. 2 and a simulation result of a comparative example.

In FIG. 9, S910 shows a simulation result of a comparative example (conventional art). S920 shows a simulation result of the band pass filter 100a of FIG. 1, and S930 shows a simulation result of the band pass filter 100b of FIG. 2. Here, the comparative example relates to a band pass filter disclosed in a reference 'Yan Jiang et al. Bandpass Filter With Ultra-Wide Upper Stopband on GaAs IPD Technology. IEEE Transactions on Circuits and Systems, Vol. 69, no. 2, pp. 389-393 2022,' and it is a band pass filter formed of a series inductor and series capacitor coupled in series between two ports to form a resonator, a shunt inductor coupled in parallel to the resonator, and a shunt capacitor coupled in parallel to the shunt inductor. In FIG. 9, the horizontal axis represents a frequency and the vertical axis represents an insertion loss ($S_{21}$ parameter).

Referring to FIG. 9, the embodiments S920 and S930 and the comparative example S910 all have band pass characteristics in a 4 GHz frequency band, and they have band cut-off characteristics in 2.5 GHz and 6 GHz frequency bands, which are adjacent to the 4 GHz band. The embodiments S920 and S930 show an improved result in harmonic attenuation characteristics of 6 GHz or more compared to the comparative example S910 due to the LPF. In addition, it can be determined that the embodiment S930 performs a two-stage low-frequency pass filter function, and thus the harmonic attenuation characteristic of 6 GHz or more is superior to that of the embodiment S920 performing a one-stage low-frequency pass filter function. That is, when a larger attenuation characteristic of harmonics is required, the low frequency pass filter function can be increased to N stages as shown in FIG. 4.

Figure 10:
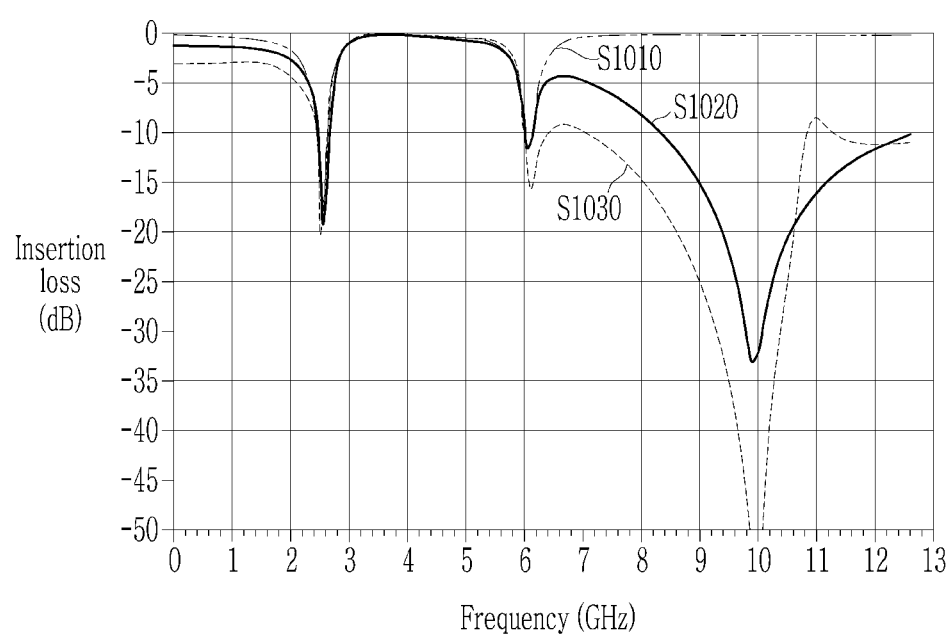
FIG. 10 is a graph that shows a simulation result of the embodiments shown in FIG. 5 and FIG. 6 and a simulation result of a comparative example.

FIG. 10 is a graph that shows a simulation result of the embodiment shown in FIG. 5 and FIG. 6 and a simulation result of a comparative example.

In FIG. 10, S1010 shows a simulation result of a comparative example (conventional art). S1020 shows a simulation result of the band pass filter 100e of FIG. 5, and S1030 shows a simulation result of the band pass filter 100f of FIG. 6. Here, the comparative example relates to a band pass filter disclosed in a references 'Yan Jiang et al. Bandpass Filter With Ultra-Wide Upper Stopband on GaAs IPD Technology. IEEE Transactions on Circuits and Systems, Vol. 69, no. 2, pp. 389-393 2022,' and it is a band pass filter formed of a series inductor and series capacitor coupled in series between two ports to form a resonator, a shunt inductor coupled in parallel to the resonator, and a shunt capacitor coupled in parallel to the shunt inductor. In FIG. 10, the horizontal axis represents a frequency and the vertical axis represents an insertion loss ($S_{21}$ parameter).

Referring to FIG. 10, the embodiments S1020 and S1030 and the comparative example S1010 all have band pass characteristics in a 4 GHz frequency band, and they have band cut-off characteristics in 2.5 GHz and 6 GHz frequency bands, which are adjacent to the 4 GHz band.

The embodiments S1020 and S1030 show results with improved harmonic attenuation characteristics compared to the comparative example S1010 by selectively cutting off a high frequency band of 10 GHz through a band stop filter function.

In addition, comparing FIG. 9 and FIG. 10, it can be determined that the harmonic attenuation characteristics of the embodiments S1020 and S1030 are superior to those of the embodiments S920 and S930. That is, the band pass filters 100e and 100f shown in FIG. 5 and FIG. 6 perform a band stop filter function for harmonic attenuation, and thus they have excellent harmonic attenuation characteristics compared to the band pass filters 100a and 100b performing a low-pass band function shown in FIG. 1 and FIG. 2. However, when the frequency is higher than the cut-off band of 10 GHz, the band pass filters 100a and 100b shown in FIG. 1 and FIG. 2 have a better attenuation characteristic than the band pass filters 100e and 100f shown in FIG. 5 and FIG. 6.

Figure 11:
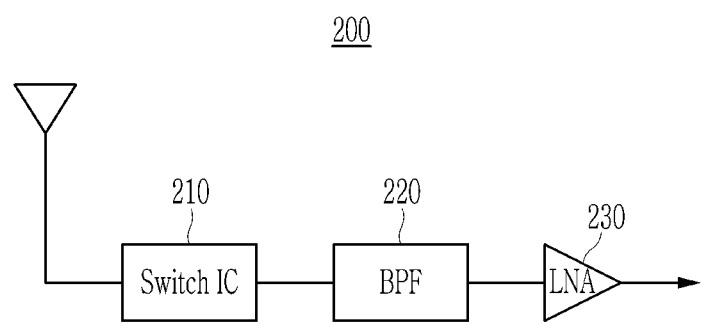
FIG. 11 is a block diagram of a receiving module 200 according to embodiment.

FIG. 11 is a block diagram of a receiving module 200 according to an embodiment.

As shown in FIG. 11, the receiver module 200 may include a switch integrated circuit (IC) 210, a band pass filter 220, and a low noise amplifier (LNA) 230.

The switch IC 210 may include at least one switch and may switch an RF signal received through an antenna to a band pass filter 220. Here, the switch IC 210 may separate and switch a transmission RF signal and a receiving RF signal.

The band pass filter 220 may pass a main frequency band in the RF signal transmitted from the switch IC 210. Here, the band pass filter 220 may be any one of the band pass filters 100a, 100b, 100c, 100d, 100e, 100f, 100g, and 100h shown in FIG. 1 to FIG. 8.

The low noise amplifier 230 may amplify the RF signal filtered by the band pass filter 220. Since the received RF signal may be weak, the low noise amplifier 230 amplifies the received RF signal.

According to one or more embodiments of the disclosure, a band pass filter may have a band pass characteristic through a resonator connected between two ports, and may have a cut-off characteristic at both ends of a band adjacent to the pass band through an inductor coupled in parallel with the resonator and a capacitor coupled in parallel to the resonator. In addition, it is possible to improve the cut-off characteristic for a high frequency band that is adjacent to a main frequency band and improve the harmonic attenuation characteristic by providing a low frequency pass filter function through a capacitor connected to the ground between the two ports.

In addition, according to one or more embodiments of the disclosure, harmonic attenuation characteristics can be further improved by providing a band stop filter function through a capacitor and an inductor connected to the ground between two ports.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A band pass filter comprising:
a resonator including a first inductor and a first capacitor coupled in series between a first port and a second port;
a second inductor coupled in parallel with the resonator;
a second capacitor coupled in parallel with the resonator;
a third capacitor coupled between one end of the second capacitor and the ground to perform a low pass filter function;
a third inductor coupled in series between the third capacitor and the ground; and
a fourth capacitor and a fourth inductor coupled in series between the other end of the second capacitor and the ground.

2. The band pass filter of claim 1, wherein:
the third capacitor is coupled between a node between the second capacitor and the fourth capacitor and the ground.

3. The band pass filter of claim 2, further comprising:
a fifth capacitor coupled between the first port and the ground; and
a sixth capacitor coupled between the second port and the ground.

4. The band pass filter of claim 1, wherein:
the third capacitor reduces a harmonic frequency component included in a high frequency band in a radio frequency (RF) signal input to the first port.

5. The band pass filter of claim 1, wherein:
the third capacitor and the third inductor are configured to perform a band stop filter function.

6. The band pass filter of claim 1,
wherein the third capacitor is coupled between a node between the second capacitor and the fourth capacitor, and the ground.

7. The band pass filter of claim 6, further comprising:
a fifth capacitor and a fourth inductor coupled in series between the first port and the ground; and
a sixth capacitor and a fifth inductor coupled to each other between the second port and the ground.

8. A receiving module comprising:
a switch integrated circuit (IC) that switches a received radio frequency (RF) signal;
a band pass filter that passes a main frequency band in the RF signal transmitted from the switch IC; and
a low noise amplifier that amplifies a signal transmitted from the band pass filter,
wherein the band pass filter comprises:
a resonator including a first inductor and a first capacitor coupled in series between an input port and an output port of the band pass filter;
a second inductor coupled between the input port and the output port and coupled in parallel with the resonator;
a second capacitor coupled between the input port and the output port and coupled in parallel with the resonator;
a third capacitor coupled between one end of the second capacitor and the ground to perform a low pass filter function;
a third inductor coupled in series between the third capacitor and the ground; and
a fourth capacitor and a fourth inductor coupled in series between the other end of the second capacitor and the ground,
wherein the third capacitor and the third inductor are configured to perform a band stop filter function.

9. The receiving module of claim 8, wherein:
the third capacitor is coupled between a node between the second capacitor and the fourth capacitor and the ground.

10. The receiving module of claim 9, wherein:
the band pass filter further comprises:
a fifth capacitor coupled between the input port and the ground; and
a sixth capacitor coupled between the output port and the ground.

11. The receiving module of claim 8, wherein:
the band pass filter further comprises:
a fifth capacitor and a fourth inductor coupled in series between the input port and the ground; and
a sixth capacitor and a fifth inductor coupled to each other between the output port and the ground.

* * * * *